United States Patent
Yim et al.

(10) Patent No.: US 7,056,560 B2
(45) Date of Patent: *Jun. 6, 2006

(54) ULTRA LOW DIELECTRIC MATERIALS BASED ON HYBRID SYSTEM OF LINEAR SILICON PRECURSOR AND ORGANIC POROGEN BY PLASMA-ENHANCED CHEMICAL VAPOR DEPOSITION (PECVD)

(75) Inventors: Kang Sub Yim, Santa Clara, CA (US); Yi Zheng, San Jose, CA (US); Srinivas D. Nemani, Sunnyvale, CA (US); Li-Qun Xia, Santa Clara, CA (US); Eric P. Hollar, Cupertino, CA (US)

(73) Assignee: Applies Materials Inc., Santa Clara, CA (US)

( * ) Notice: Subject to any disclaimer, the term of this patent is extended or adjusted under 35 U.S.C. 154(b) by 10 days.

This patent is subject to a terminal disclaimer.

(21) Appl. No.: 10/773,060

(22) Filed: Feb. 4, 2004

(65) Prior Publication Data

US 2004/0156987 A1    Aug. 12, 2004

Related U.S. Application Data

(63) Continuation-in-part of application No. 10/302,393, filed on Nov. 22, 2002.

(60) Provisional application No. 60/378,799, filed on May 8, 2002.

(51) Int. Cl.
*C23C 16/56* (2006.01)
*C23C 16/48* (2006.01)
*C23C 16/42* (2006.01)
*C23C 16/40* (2006.01)
*H01L 21/473* (2006.01)

(52) U.S. Cl. .......... 427/551; 427/255.37; 427/249.15; 438/789; 438/786

(58) Field of Classification Search ............... 427/488, 427/489, 497, 503, 515, 551, 552, 563, 574, 427/579, 255.37; 438/788, 789, 790, 780
See application file for complete search history.

(56) References Cited

U.S. PATENT DOCUMENTS

| | | |
|---|---|---|
| 4,845,054 A | 7/1989 | Mitchener |
| 5,000,113 A | 3/1991 | Wang et al. |
| 5,003,178 A | 3/1991 | Livesay |
| 5,186,718 A | 2/1993 | Tepman et al. |
| 5,554,570 A | 9/1996 | Maeda et al. |

(Continued)

FOREIGN PATENT DOCUMENTS

EP    0 935 283 A2    8/1999

(Continued)

OTHER PUBLICATIONS

PCT International Search Report for PCT/US 03/14272 dated Jan. 21, 2004.

(Continued)

Primary Examiner—Marianne Padgett
(74) Attorney, Agent, or Firm—Patterson & Sheridan

(57) ABSTRACT

A method for depositing a low dielectric constant film is provided by reacting a gas mixture including one or more linear, oxygen-free organosilicon compounds, one or more oxygen-free hydrocarbon compounds comprising one ring and one or two carbon-carbon double bonds in the ring, and one or more oxidizing gases. Optionally, the low dielectric constant film is post-treated after it is deposited. In one aspect, the post treatment is an electron beam treatment.

10 Claims, 6 Drawing Sheets

U.S. PATENT DOCUMENTS

| | | | |
|---|---|---|---|
| 5,628,828 | A | 5/1997 | Kawamura et al. |
| 5,776,990 | A | 7/1998 | Hedrick et al. |
| 5,855,681 | A | 1/1999 | Maydan et al. |
| 5,989,998 | A | 11/1999 | Sugahara et al. |
| 6,051,321 | A | 4/2000 | Lee et al. |
| 6,054,379 | A | 4/2000 | Yau et al. |
| 6,057,251 | A | 5/2000 | Goo et al. |
| 6,068,884 | A | 5/2000 | Rose et al. |
| 6,080,526 | A | 6/2000 | Yang et al. |
| 6,159,871 | A | 12/2000 | Loboda et al. |
| 6,169,039 | B1 | 1/2001 | Lin et al. |
| 6,270,900 | B1 * | 8/2001 | Wakizaka et al. ........... 428/416 |
| 6,271,146 | B1 | 8/2001 | Ross |
| 6,303,047 | B1 | 10/2001 | Aronowitz et al. |
| 6,312,793 | B1 | 11/2001 | Grill et al. |
| 6,316,063 | B1 | 11/2001 | Andideh et al. |
| 6,340,628 | B1 | 1/2002 | Van Cleemput et al. |
| 6,352,945 | B1 | 3/2002 | Matsuki et al. |
| 6,383,955 | B1 | 5/2002 | Matsuki et al. |
| 6,407,399 | B1 | 6/2002 | Livesay |
| 6,410,463 | B1 | 6/2002 | Matsuki |
| 6,432,846 | B1 | 8/2002 | Matsuki |
| 6,437,443 | B1 | 8/2002 | Grill et al. |
| 6,441,491 | B1 | 8/2002 | Grill et al. |
| 6,444,136 | B1 | 9/2002 | Liu et al. |
| 6,455,445 | B1 | 9/2002 | Matsuki |
| 6,479,110 | B1 | 11/2002 | Grill et al. |
| 6,486,082 | B1 | 11/2002 | Cho et al. |
| 6,500,773 | B1 | 12/2002 | Gaillard et al. |
| 6,509,259 | B1 | 1/2003 | Wang et al. |
| 6,514,880 | B1 | 2/2003 | Matsuki et al. |
| 6,524,874 | B1 | 2/2003 | Alwan |
| 6,541,367 | B1 | 4/2003 | Mandal |
| 6,548,899 | B1 | 4/2003 | Ross |
| 6,582,777 | B1 * | 6/2003 | Ross et al. .................. 427/551 |
| 6,583,048 | B1 | 6/2003 | Vincent et al. |
| 6,583,071 | B1 | 6/2003 | Weldman et al. |
| 6,593,655 | B1 | 7/2003 | Loboda et al. |
| 6,596,627 | B1 | 7/2003 | Mandal |
| 6,605,549 | B1 * | 8/2003 | Leu et al. .................. 438/758 |
| 6,677,253 | B1 | 1/2004 | Andideh et al. |
| 6,709,715 | B1 * | 3/2004 | Lang et al. ................. 427/489 |
| 6,797,643 | B1 * | 9/2004 | Rocha-Alvarez et al. ... 438/758 |
| 6,846,515 | B1 * | 1/2005 | Vrtis et al. ............. 427/255.29 |
| 2002/0037442 | A1 | 3/2002 | Grill et al. |
| 2002/0098714 | A1 | 7/2002 | Grill et al. |
| 2002/0142579 | A1 | 10/2002 | Vincent et al. |
| 2002/0142585 | A1 | 10/2002 | Mandal |
| 2002/0160626 | A1 | 10/2002 | Matsuki et al. |
| 2002/0180051 | A1 | 12/2002 | Grill et al. |
| 2002/0197849 | A1 | 12/2002 | Mandal |
| 2003/0008998 | A1 | 1/2003 | Aoi |
| 2003/0017718 | A1 | 1/2003 | Aoi |
| 2003/0040195 | A1 | 2/2003 | Chang et al. |
| 2003/0104689 | A1 | 6/2003 | Shioya et al. |
| 2003/0104708 | A1 | 6/2003 | Cho et al. |
| 2003/0109136 | A1 | 6/2003 | Shioya et al. |
| 2003/0111712 | A1 | 6/2003 | Andideh |
| 2003/0116421 | A1 | 6/2003 | Xu et al. |
| 2003/0176030 | A1 | 9/2003 | Tsuji et al. |
| 2003/0198742 | A1 | 10/2003 | Vrtis et al. |
| 2003/0224593 | A1 | 12/2003 | Wong |
| 2003/0232137 | A1 * | 12/2003 | Vrtis et al. ................ 427/248.1 |
| 2004/0038514 | A1 | 2/2004 | Hyodo et al. |
| 2004/0039219 | A1 | 2/2004 | Chen et al. |
| 2004/0096593 | A1 | 5/2004 | Lukas et al. |
| 2004/0096672 | A1 | 5/2004 | Lukas et al. |
| 2004/0175501 | A1 | 9/2004 | Lukas et al. |
| 2004/0175957 | A1 | 9/2004 | Lukas et al. |
| 2004/0197474 | A1 * | 10/2004 | Vrtis et al. ............. 427/255.28 |
| 2005/0153073 | A1 * | 7/2005 | Zheng et al. ............ 427/248.1 |
| 2005/0161060 | A1 * | 7/2005 | Johnson et al. ............... 134/1.1 |
| 2005/0227502 | A1 * | 10/2005 | Schmitt et al. ............. 438/788 |
| 2005/0230834 | A1 * | 10/2005 | Schmitt et al. ............. 257/758 |

FOREIGN PATENT DOCUMENTS

| | | |
|---|---|---|
| EP | 1 354 980 A1 | 10/2003 |
| WO | WO 97/00535 A1 | 1/1997 |
| WO | WO 99/21706 A1 | 5/1999 |
| WO | WO 01/29052 A1 | 4/2001 |
| WO | WO 01/61737 A1 | 8/2001 |
| WO | WO 03/095702 A2 | 11/2003 |

OTHER PUBLICATIONS

Paul Kallender, "Toshiba, Fujitsu Report 100-Nanometer Process Gains", EE Times, Nov. 8, 2001. http://www.eetimes.com/story/OEG20011106S0034.

PCT International Search Report and Written Opinion for PCT/US2005/003425, dated May 6, 2005.

PCT Written Opinion; PCT/US03/14272, May 8, 2003.

* cited by examiner

ULTRA LOW DIELECTRIC MATERIALS BASED ON HYBRID SYSTEM OF LINEAR SILICON PRECURSOR AND ORGANIC POROGEN BY PLASMA-ENHANCED CHEMICAL VAPOR DEPOSITION (PECVD)

CROSS-REFERENCE TO RELATED APPLICATIONS

This application is a continuation-in-part of U.S. patent application Ser. No. 10/302,393, filed Nov. 22, 2002, which claims priority to U.S. provisional patent application Ser. No. 60/378,799, filed May 8, 2002, both of which are herein incorporated by reference.

BACKGROUND OF THE INVENTION

1. Field of the Invention

The present invention relates to the fabrication of integrated circuits. More particularly, the invention relates to a method for depositing dielectric layers on a substrate and structures that include the dielectric layer.

2. Description of the Related Art

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.13 µm and even 0.1 µm feature sizes, and tomorrow's plants soon will be producing devices having even smaller geometries.

In order to further reduce the size of devices on integrated circuits, it has become necessary to use conductive materials having low resistivity and to use insulators having low dielectric constants (k) to reduce the capacitive coupling between adjacent metal lines. One such low k material is spin-on glass, such as un-doped silicon glass (USG) or fluorine-doped silicon glass (FSG), which can be deposited as a gap fill layer in a semiconductor manufacturing process. Other examples of low k materials include carbon doped silicon dioxide and polytetrafluoroethylene. However, the continued reduction in device geometries has generated a demand for films having even lower k values.

Recent developments in low dielectric constants have focused on incorporating silicon, carbon, and oxygen atoms into the deposited film. One challenge in this area has been to develop a Si, C, and O containing film that has a low k value, but also exhibits desirable thermal and mechanical properties. Most often, films made of a Si, C, and O network that have the lowest dielectric constant exhibit poor mechanical strength and are easily damaged by etch chemistry and subsequent plasma exposure, causing failure of the integrated circuit.

Therefore, there is a need for a process for making low dielectric constant materials that would improve the speed and efficiency of devices on integrated circuits as well as the durability and mechanical integrity of the integrated circuit.

SUMMARY OF THE INVENTION

The present invention generally provides a method for depositing a low dielectric constant film. In one embodiment, the method includes delivering a gas mixture comprising one or more linear, oxygen-free organosilicon compounds, one or more oxygen-free hydrocarbon compounds comprising one ring and one or two carbon-carbon double bonds in the ring, and one or more oxidizing gases to a substrate surface at deposition conditions sufficient to deposit a low dielectric constant film on the substrate surface. Optionally, the low dielectric constant film is post-treated. In one aspect, the low dielectric constant film is post-treated with an electron beam.

In a further embodiment, the method for depositing a low dielectric constant film includes delivering a gas mixture comprising one or more linear, oxygen-free organosilicon compounds, one or more oxygen-free hydrocarbon compounds including the structure:

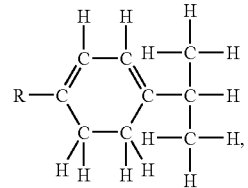

and one or more oxidizing gases to a substrate surface at deposition conditions sufficient to deposit a low dielectric constant film on the substrate surface. Optionally, the low dielectric constant film is post-treated. In one aspect, the low dielectric constant film is post-treated with an electron beam.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
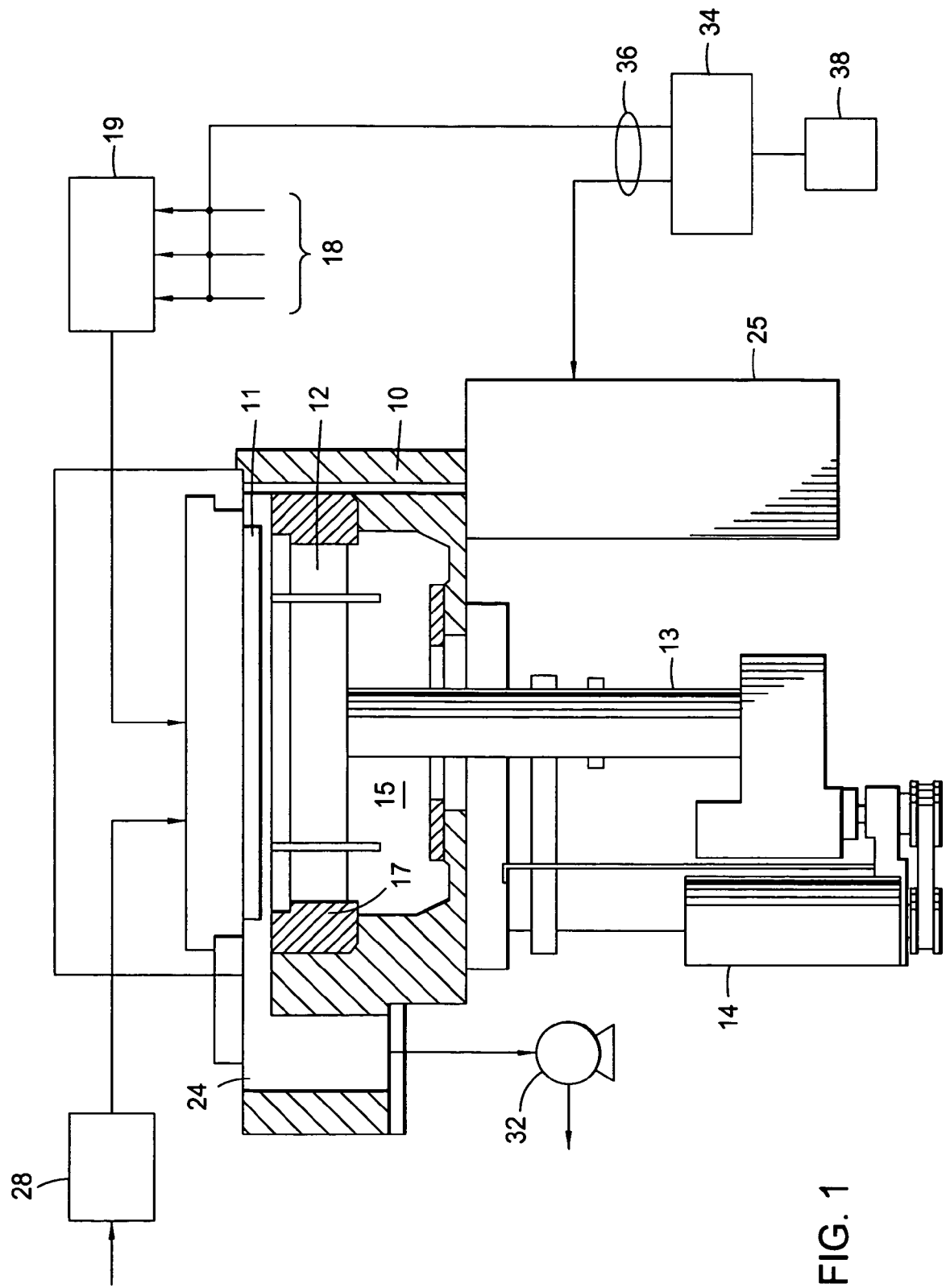
FIG. 1 is a cross-sectional diagram of an exemplary CVD reactor configured for use according to embodiments described herein.

The present invention includes a method of depositing low dielectric constant films comprising silicon, oxygen, and carbon by reacting one or more linear, oxygen-free organosilicon compounds, one or more oxygen-free hydrocarbon compounds comprising one ring and one or two carbon-carbon double bonds in the ring, and one or more oxidizing gases at conditions sufficient to form a pre-treated film network. The film may be deposited using plasma assistance within a processing chamber capable of performing chemical vapor deposition (CVD). The plasma may be generated using constant radio frequency (RF) power, pulsed radio frequency, high frequency RF, dual frequency RF, dual phase RF, or any other known or yet to be discovered plasma generation technique.

Following deposition of the film, the film may be post-treated, e.g., cured with an electron beam (e-beam), to remove pendant organic groups, such as cyclic groups, i.e., rings, of organic compounds that have been incorporated into the film network during deposition. Post-treating the film supplies energy to the film network to volatize and remove at least a portion of the organic groups, such as organic cyclic groups in the film network, leaving behind a more porous film network having a lower dielectric constant. In most cases, the film cured with an electron beam demonstrates a hardness at least two times, and as much as 600%, more than a non-cured film deposited according to embodiments described herein. Films cured using e-beam show an unexpected reduction in k value and an unexpected increase in hardness, which are not achievable with conventional curing techniques. Typically, the cured film has a dielectric constant of about 2.5 or less, preferably about 2.2 or less, and a hardness greater than about 0.6 GPa.

The term "organosilicon compound" as used herein is intended to refer to silicon-containing compounds including carbon atoms in organic groups. Organic groups may include alkyl, alkenyl, and vinyl groups in addition to functional derivatives thereof. Preferably, the organosilicon compounds includes one or more carbon atoms attached to a silicon atom whereby the carbon atoms are not readily removed by oxidation at suitable processing conditions.

Suitable linear, oxygen-free organosilicon compounds include aliphatic organosilicon compounds having linear or branched structures with one or more silicon atoms and one or more carbon atoms. Some exemplary linear, oxygen-free organosilicon compounds include:

| | |
|---|---|
| methylsilane, | $CH_3—SiH_3$ |
| dimethylsilane, | $(CH_3)_2—SiH_2$ |
| trimethylsilane, | $(CH_3)_3—SiH$ |
| tetramethylsilane, | $(CH_3)_4—Si$ |
| ethylsilane, | $CH_3—CH_2—SiH_3$ |
| disilanomethane, | $SiH_3—CH_2—SiH_3$ |
| bis(methylsilano)methane, | $CH_3—SiH_2—CH_2—SiH_2—CH_3$ |
| 1,2-disilanoethane, | $SiH_3—CH_2—CH_2—SiH_3$ |
| 1,2-bis(methylsilano)ethane, | $CH_3—SiH_2—CH_2—CH_2—SiH_2—CH_3$ |
| 2,2-disilanopropane, | $SiH_3—C(CH_3)_2—SiH_3$ |
| diethylsilane, | $(C_2H_5)_2—SiH_2$ |
| propylsilane, | $C_3H_7—SiH_3$ |
| vinylmethylsilane, | $(CH_2=CH)—SiH_2—CH_3$ |
| 1,1,2,2-tetramethyldisilane, | $(CH_3)_2—SiH—SiH—(CH_3)_2$ |
| hexamethyldisilane, | $(CH_3)_3—Si—Si—(CH_3)_3$ |
| 1,1,2,2,3-hexamethyltrisilane, | $(CH_3)_2—SiH—Si(CH_3)_2—SiH—(CH_3)_2$ |
| 1,1,2,3,3-pentamethyltrisilane, | $(CH_3)_2—SiH—SiH(CH_3)—SiH—(CH_3)_2$ |
| 1,3-bis(methylsilano)propane, | $CH_3—SiH_2—(CH_2)_3—SiH_2—CH_3$ |
| 1,2-bis(dimethylsilano)ethane, | $(CH_3)_2—SiH—(CH_2)_2—SiH—(CH_3)_2$ |
| and | |
| 1,3-bis(dimethylsilano)propane | $(CH_3)_2—Si—(CH_2)_3—Si—(CH_3)_2.$ |

The one or more linear, oxygen-free organosilicon compounds are reacted with one or more oxygen-free hydrocarbon compounds comprising one ring and one or two carbon-carbon double bonds in the ring. The ring may contain as few as four atoms. Further, the ring is preferably bonded to a linear or branched functional group. The linear or branched functional group preferably contains an alkyl or vinyl alkyl group and has between one and twenty carbon atoms. In a preferred embodiment, the oxygen-free hydrocarbon compound has the general structure:

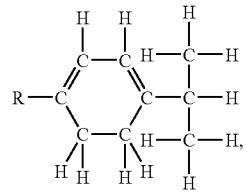

wherein R is selected from the group consisting of linear alkane groups having one to five carbons. In one embodiment, R is a methyl group and the oxygen-free hydrocarbon compound is commercially available as alpha-terpinene (ATP).

The one or more linear, oxygen-free organosilicon compounds and the one or more oxygen-free hydrocarbon compounds are reacted with one or more oxidizing gases. Suitable oxidizing gasses include oxygen ($O_2$), ozone ($O_3$), nitrous oxide ($N_2O$), carbon monoxide (CO), carbon dioxide ($CO_2$), water ($H_2O$), 2,3-butane dione or combinations thereof. When ozone is used as an oxidizing gas, an ozone generator converts from 6% to 20%, typically about 15%, by weight of the oxygen in a source gas to ozone, with the remainder typically being oxygen. However, the ozone concentration may be increased or decreased based upon the amount of ozone desired and the type of ozone generating equipment used. Disassociation of oxygen or the oxygen containing compounds may occur in a microwave chamber prior to entering the deposition chamber to reduce excessive dissociation of the silicon containing compounds. Preferably, radio frequency (RF) power is applied to the reaction zone to increase dissociation.

Optionally, one or more carrier gases are introduced into the deposition chamber in addition to the one or more linear, oxygen-free organosilicon compounds, the one or more oxygen-free hydrocarbon compounds, and the one or more oxidizing gases. Examples of carrier gases that may be used include helium, argon, hydrogen, ethylene, and combinations thereof.

Also, optionally, one or more oxygen-containing organosilicon compounds are introduced into the deposition chamber in addition to the one or more linear, oxygen-free organosilicon compounds, the one or more oxygen-free hydrocarbon compounds, and the one or more oxidizing gases. Some exemplary oxygen-containing compounds include:

| | |
|---|---|
| 1,3,5,7-tetramethylcyclotetrasiloxane (TMCTS), | —(—SiHCH$_3$—O—)$_4$-(cyclic) |
| octamethylcyclotetrasiloxane (OMCTS), | —(—Si(CH$_3$)$_2$—O—)$_4$-(cyclic) |
| 1,3,5,7,9-pentamethylcyclopentasiloxane, | —(—SiHCH$_3$—O—)$_5$-(cyclic) |
| 1,3,5,7-tetrasilano-2,6-dioxy-4,8-dimethylene, | —(—SiH$_2$—CH$_2$—SiH$_2$—O—)$_2$-(cyclic) |
| hexamethylcyclotrisiloxane, | —(—Si(CH$_3$)$_2$—O—)$_3$-(cyclic) |
| diethoxymethylsilane (DEMS), | CH$_3$—SiH—(O—CH$_2$—CH$_3$)$_2$ |
| 1,3-dimethyldisiloxane, | CH$_3$—SiH$_2$—O—SiH$_2$—CH$_3$ |
| 1,1,3,3-tetramethyldisiloxane, | (CH$_3$)$_2$—SiH—O—SiH—(CH$_3$)$_2$ |
| hexamethyldisiloxane (HMDS), | (CH$_3$)$_3$—Si—O—Si—(CH$_3$)$_3$ |
| 1,3-bis(silanomethylene)disiloxane, | (SiH$_3$—CH$_2$—SiH$_2$—)$_2$—O |
| bis(1-methyldisiloxanyl)methane, | (CH$_3$—SiH$_2$—O—SiH$_2$—)$_2$—CH$_2$ |
| 2,2-bis(1-methyldisiloxanyl)propane, | (CH$_3$—SiH$_2$—O—SiH$_2$—)$_2$—C(CH$_3$)$_2$ |
| hexamethoxydisiloxane (HMDOS), | (CH$_3$O)$_3$—Si—O—Si—(OCH$_3$)$_3$ |
| dimethyldimethoxysilane (DMDMOS), and | (CH$_3$O)$_2$—Si—(CH$_3$)$_2$ |
| dimethoxymethylvinylsilane (DMMVS), | (CH$_3$O)$_2$—Si—(CH$_3$)—CH$_2$=CH$_3$. |

Preferably, the deposited film has a carbon content between about 5 and about 30 atomic percent excluding hydrogen atoms, such as between about 10 and about 30 atomic percent after curing. The carbon content of the deposited films refers to an elemental analysis of the film structure. The carbon content is represented by the percent of carbon atoms in the deposited, film, excluding hydrogen atoms, which are difficult to quantify. For example, a film having an average of one silicon atom, one oxygen atom, one carbon atom and two hydrogen atoms has a carbon content of 20 atomic percent (one carbon atom per five total atoms), or a carbon content of 33 atomic percent excluding hydrogen atoms (one carbon atom per three total atoms).

During deposition, the substrate is typically maintained at a temperature between about 25° C. and about 350° C. A power density ranging between about 0.07 W/cm$^2$ and about 2.8 W/cm$^2$, which is a RF power level of between about 50 W and about 2000 W for a 300 mm substrate is typically used. Preferably, the RF power level is between about 100 W and about 1500 W. The RF power is provided at a frequency between about 0.01 MHz and 300 MHz. The RF power may be cycled or pulsed to reduce heating of the substrate and promote greater porosity in the deposited film. The RF power may also be continuous or discontinuous.

In one aspect, the one or more linear, oxygen-free organosilicon compounds are introduced into a chemical vapor deposition chamber at a flowrate of about 100 to about 2,000 sccm, such as between about 300 and about 2,000 sccm, preferably about 1,000 sccm. The one or more oxygen-free hydrocarbon compounds are introduced to the chemical vapor deposition chamber at a flowrate of about 100 to about 5,000 mgm, such as between about 500 and about 5,000 mgm, preferably about 3,000 mgm. Most preferably, the ratio of the flowrate of the oxygen-free organosilicon compound to the flowrate of the oxygen-free hydrocarbon compound is about 1:3. The one or more oxidizing gases have a flowrate between about 50 and about 5,000 sccm, such as between about 100 and about 1,000 sccm, preferably about 200 sccm. The one or more optional carrier gases have a flowrate between about 500 sccm and about 5,000 sccm. Preferably, the linear, oxygen-free organosilicon compound is trimethylsilane, the oxygen-free hydrocarbon compound is alpha-terpinene, and the oxidizing gas is oxygen mixed with carbon dioxide.

Preferably, after the low dielectric constant film is deposited, the film is post-treated. The film may be post-treated with a thermal or plasma enhanced annealing process or an electron beam treatment. In one embodiment, the film is annealed at a temperature between about 200° C. and about 400° C. for about 2 seconds to about 1 hour, preferably about 30 minutes. A non-reactive gas such as helium, hydrogen, nitrogen, or a mixture thereof is introduced at a rate of 100 to about 10,000 sccm. The chamber pressure is maintained between about 2 Torr and about 10 Torr. The RF power during the annealing is about 200 W to about 1,000 W at a frequency of about 13.56 MHz, and the preferable substrate spacing is between about 300 mils and about 800 mils. Annealing the low dielectric constant film at a substrate temperature of about 200° C. to about 400° C. after the low dielectric constant film is deposited volatilizes at least some of the organic groups in the film, forming voids in the film. Organic groups that may be volatilized are derived from organic components of the gas mixtures described herein, such as the ring of the one or more oxygen-free hydrocarbon compounds comprising one ring and one or two carbon-carbon double bonds in the ring.

In another embodiment, the low dielectric constant film is post-treated with an electron beam treatment. The e-beam treatment typically has a dose between about 50 and about 2000 micro coulombs per square centimeter (μc/cm$^2$) at about 1 to 20 kiloelectron volts (KeV). The e-beam treatment is typically operated at a temperature between about room-temperature and about 450° C. for about 1 minute to about 15 minutes, such as about 2 minutes. Preferably, the e-beam treatment is performed at about 400° C. for about 2 minutes. In one aspect, the e-beam treatment conditions include 4.5 kV, 1.5 mA and 150 μc/cm$^2$ at 400° C. Although any e-beam device may be used, one exemplary device is the EBK chamber, available from Applied Materials, Inc.

The e-beam curing process improves mechanical strength of the deposited film network and also lowers the k-value. The energized e-beam alters the chemical bonding in the molecular network of the deposited film and removes at least a portion of the molecular groups, such as organic components from the ring of the one or more oxygen-free hydrocarbon compounds comprising one ring and one or two carbon-carbon double bonds in the ring, from the film. The removal of the molecular groups creates voids or pores within the film, lowering the k value. The e-beam treatment also strengthens the film network by cross-linking Si—O—Si or Si—C—Si chains as inferred from FTIR spectroscopy.

An exemplary processing chamber for depositing a low dielectric film according to embodiments described herein is described below.

Exemplary CVD Reactor

FIG. 1 shows a vertical, cross-section view of a parallel plate chemical vapor deposition processing chamber 10 having a high vacuum region 15. The processing chamber 10 contains a gas distribution manifold 11 having perforated holes for dispersing process gases there-through to a substrate (not shown). The substrate rests on a substrate support plate or susceptor 12. The susceptor 12 is mounted on a support stem 13 which connects the susceptor 12 to a lift motor 14. The lift motor 14 raises and lowers the susceptor 12 between a processing position and a lower, substrate-loading position so that the susceptor 12 (and the substrate supported on the upper surface of susceptor 12) can be controllably moved between a lower loading/off-loading position and an upper processing position which is closely adjacent to the manifold 11. When the susceptor 12 and the substrate are in the upper processing position, they are surrounded by an insulator 17.

During processing, gases introduced to the manifold 11 are uniformly distributed radially across the surface of the substrate. A vacuum pump 32 having a throttle valve controls the exhaust rate of gases from the chamber through a manifold 24. Deposition and carrier gases flow through gas lines 18 into a mixing system 19 and then to the manifold 11. Generally, each process gas supply line 18 includes (i) safety shut-off valves (not shown) that can be used to automatically or manually shut off the flow of process gas into the chamber, and (ii) mass flow controllers (also not shown) to measure the flow of gas through the gas supply lines when toxic gases are used in the process, several safety shut-off valves are positioned on each gas supply line 18 in conventional configurations.

The deposition process performed in the processing chamber 10 can be either a thermal process or a plasma enhanced process. In a plasma process, a controlled plasma is typically formed adjacent the substrate by RF energy applied to the gas distribution manifold 11 using a RF power supply 25. Alternatively, RF power can be provided to the susceptor 12 or RF power can be provided to different components at different frequencies. The RF power supply 25 can supply either single or mixed frequency RF power to enhance the decomposition of reactive species introduced into the high vacuum region 15. A mixed frequency RF power supply typically supplies power at a high RF frequency (RF1) of 13.56 MHz to the distribution manifold 11 and at a low RF frequency (RF2) of 360 KHz to the susceptor 12.

When additional dissociation of the oxidizing gas is desired, an optional microwave chamber 28 can be used to input from between about 0 Watts and about 6000 Watts to the oxidizing gas prior to the gas entering the processing chamber 10. The additional microwave power can avoid excessive dissociation of the organosilicon compounds prior to reaction with the oxidizing gas. A gas distribution plate (not shown) having separate passages for the organosilicon compound and the oxidizing gas is preferred when microwave power is added to the oxidizing gas.

Typically, any or all of the chamber lining, distribution manifold 11, susceptor 12, and various other reactor hardware is made out of material such as aluminum or anodized aluminum. An example of such a CVD reactor is described in commonly assigned U.S. Pat. No. 5,000,113, entitled "A Thermal CVD/PECVD Reactor and Use for Thermal Chemical Vapor Deposition of Silicon Dioxide and In-situ Multi-step Planarized Process", issued to Wang et al., which is incorporated by reference herein. The processing system 10 may be integrated into an integrated processing platform, such as a Producer® platform available from Applied Materials, Inc. Details of the Producer® platform are described in commonly assigned U.S. Pat. No. 5,855,681, entitled "Ultra High Throughput Wafer Vacuum Processing System", issued to Maydan et al., which is incorporated by reference herein.

A system controller 34 controls the motor 14, the gas mixing system 19, and the RF power supply 25 which are connected therewith by control lines 36. The system controller 34 controls the activities of the CVD reactor and typically includes a hard disk drive, a floppy disk drive, and a card rack. The card rack contains a single board computer (SBC), analog and digital input/output boards, interface boards, and stepper motor controller boards. The system controller 34 conforms to the Versa Modular Europeans (VME) standard which defines board, card cage, and connector dimensions and types. The VME standard also defines the bus structure having a 16-bit data bus and 24-bit address bus.

Figure 2:
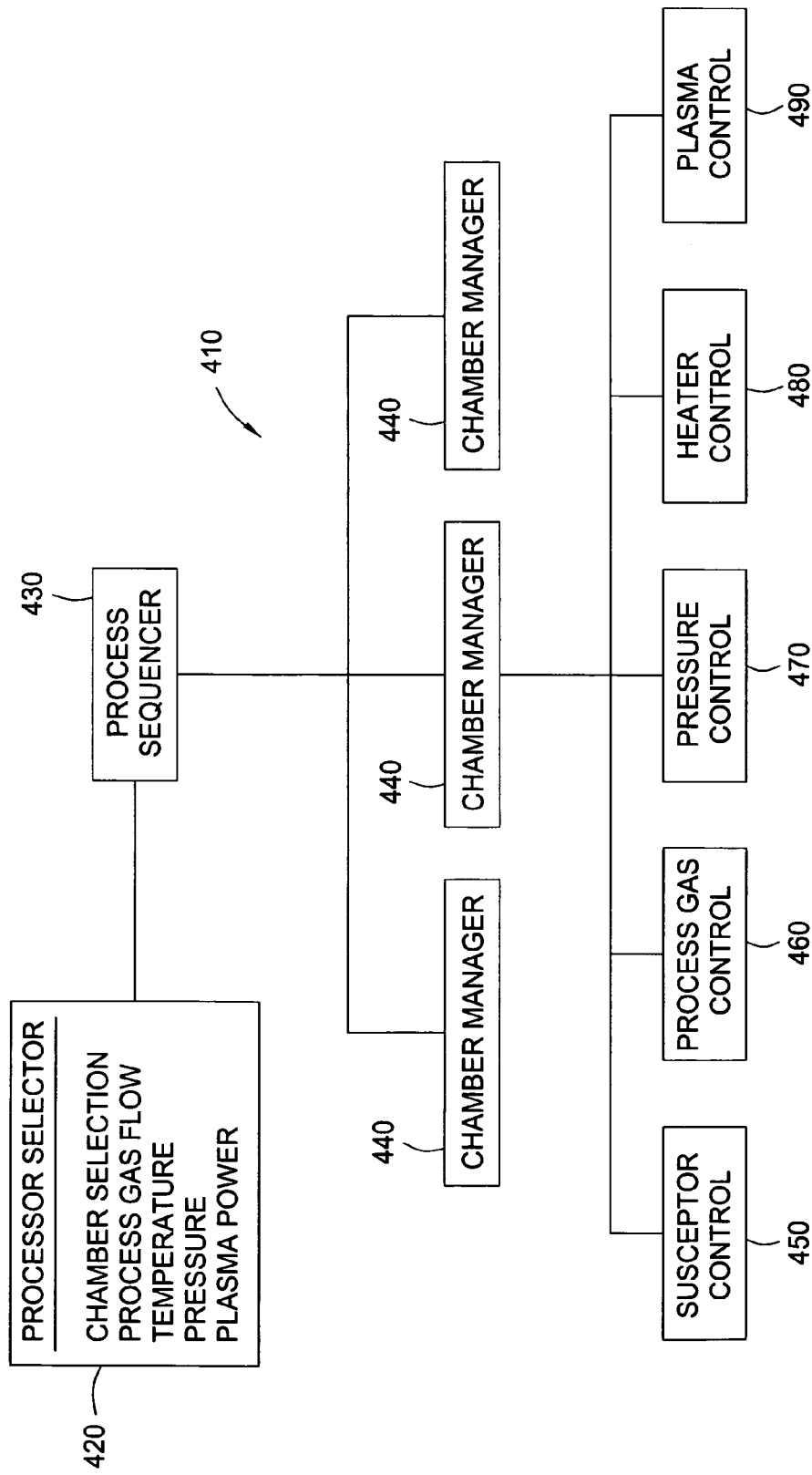
FIG. 2 is a flow chart of a hierarchical control structure of a computer program useful in conjunction with the exemplary CVD reactor of FIG. 1.

FIG. 2 is a flow chart of a hierarchical control structure of a computer program product useful in conjunction with the exemplary CVD reactor of FIG. 1. The system controller 34 operates under the control of a computer program 410 stored on the hard disk drive 38. The computer program dictates the timing, mixture of gases, RF power levels, susceptor position, and other parameters of a particular process. The computer program code can be written in any conventional computer readable programming language such as, for example, 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of pre-compiled windows library routines. To execute the linked compiled object code, the system user invokes the object code, causing the computer system to load the code in memory, from which the CPU reads and executes the code to perform the tasks identified in the program.

Still referring to FIG. 2, a user enters a process set number and process chamber number into a process selector subroutine 420 in response to menus or screens displayed on the CRT monitor by using the light pen interface. The process sets are predetermined sets of process parameters necessary to carry out specified processes, and are identified by pre-defined set numbers. The process selector subroutine 420 (i) selects a desired process chamber on a cluster tool such as an Centura® platform (available from Applied Materials, Inc.), and (ii) selects a desired set of process parameters needed to operate the process chamber for performing the desired process. The process parameters for performing a specific process are provided to the user in the form of a recipe and relate to process conditions such as, for example, process gas composition, flow rates, temperature, pressure, plasma conditions such as RF bias power levels and magnetic field power levels, cooling gas pressure, and chamber wall temperature. The parameters specified by the recipe are entered utilizing the light pen/CRT monitor interface. The signals for monitoring the process are provided by the analog input and digital input boards of the system controller 34 and the signals for controlling the process are output to the analog output and digital output boards of the system controller 34.

A process sequencer subroutine 430 comprises program code for accepting the identified process chamber and set of process parameters from the process selector subroutine 420, and for controlling operation of the various process chambers. Multiple users can enter process set numbers and process chamber numbers, or a user can enter multiple process chamber numbers, so the sequencer subroutine 430 operates to schedule the selected processes in the desired sequence. Preferably the sequencer subroutine 430 includes computer readable program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling a process execute, the sequencer subroutine 430 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 430 determines which process chamber and process set combination is going to be executed next, the sequencer subroutine 430 causes execution of the process set by passing the particular process set parameters to a chamber manager subroutine 440 which controls multiple processing tasks in a process chamber according to the process set determined by the sequencer subroutine 430. For example, the chamber manager subroutine 440 includes program code for controlling CVD process operations in the process chamber 10. The chamber manager subroutine 440 also controls execution of various chamber component subroutines which control operation of the chamber component necessary to carry out the selected process set. Examples of chamber component subroutines are susceptor control subroutine 450, process gas control subroutine 460, pressure control subroutine 470, heater control subroutine 480, and plasma control subroutine 490. Those having ordinary skill in the art would readily recognize that other chamber control subroutines can be included depending on what processes are desired to be performed in a processing chamber.

In operation, the chamber manager subroutine 440 selectively schedules or calls the process component subroutines in accordance with the particular process set being executed. The chamber manager subroutine 440 schedules the process component subroutines similarly to how the sequencer subroutine 430 schedules which process chamber and process set is to be executed next. Typically, the chamber manager subroutine 440 includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 2. The susceptor control positioning subroutine 450 comprises program code-for controlling chamber components that are used to load the substrate onto the susceptor 12, and optionally to lift the substrate to a desired height in the processing chamber 10 to control the spacing between the substrate and the gas distribution manifold 11. When a substrate is loaded into the processing chamber 10, the susceptor 12 is lowered to receive the substrate, and thereafter, the susceptor 12 is raised to the desired height in the chamber to maintain the substrate at a first distance or spacing from the gas distribution manifold 11 during the CVD process. In operation, the susceptor control subroutine 450 controls movement of the susceptor 12 in response to process set parameters that are transferred from the chamber manager subroutine 440.

The process gas control subroutine 460 has program code for controlling process gas compositions and flow rates. The process gas control subroutine 460 controls the open/close position of the safety shut-off valves, and also ramps up/down the mass flow controllers to obtain the desired gas flow rate. The process gas control subroutine 460 is invoked by the chamber manager subroutine 440, as are all chamber components subroutines, and receives from the chamber manager subroutine process parameters related to the desired gas flow rates. Typically, the process gas control subroutine 460 operates by opening the gas supply lines, and repeatedly (i) reading the necessary mass flow controllers, (ii) comparing the readings to the desired flow rates received from the chamber manager subroutine 440, and (iii) adjusting the flow rates of the gas supply lines as necessary. Furthermore, the process gas control subroutine 460 includes steps for monitoring the gas flow rates for unsafe rates, and activating the safety shut-off valves when an unsafe condition is detected.

In some processes, an inert gas such as helium or argon is put into the processing chamber 10 to stabilize the pressure in the chamber before reactive process gases are introduced. For these processes, the process gas control subroutine 460 is programmed to include steps for flowing the inert gas into the chamber 10 for an amount of time necessary to stabilize the pressure in the chamber, and then the steps described above would be carried out. Additionally, when a process gas is to be vaporized from a liquid precursor, the process gas control subroutine 460 would be written to include steps for bubbling a delivery gas such as helium through the liquid precursor in a bubbler assembly. For this type of process, the process gas control subroutine 460 regulates the flow of the delivery gas, the pressure in the bubbler, and the bubbler temperature in order to obtain the desired process gas flow rates. As discussed above, the desired process gas flow rates are transferred to the process gas control subroutine 460 as process parameters. Furthermore, the process gas control subroutine 460 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 470 comprises program code for controlling the pressure in the processing chamber 10 by regulating the size of the opening of the throttle valve in the exhaust pump 32. The size of the opening of the throttle valve is set to control the chamber pressure to the desired level in relation to the total process gas flow, size of the process chamber, and pumping set point pressure for the exhaust pump 32. When the pressure control subroutine 470 is invoked, the desired, or target pressure level is received as a parameter from the chamber manager subroutine 440. The pressure control subroutine 470 operates to measure the pressure in the processing chamber 10 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 470 can be written to open or close the throttle valve to a particular opening size to regulate the processing chamber 10 to the desired pressure.

The heater control subroutine 480 comprises program code for controlling the temperature of the heat modules or radiated heat that is used to heat the susceptor 12. The heater control subroutine 480 is also invoked by the chamber manager subroutine 440 and receives a target, or set point, temperature parameter. The heater control subroutine 480 measures the temperature by measuring voltage output of a thermocouple located in a susceptor 12, compares the measured temperature to the set point temperature, and increases or decreases current applied to the heat module to obtain the set point temperature. The temperature is obtained from the measured voltage by looking up the corresponding temperature in a stored conversion table, or by calculating the temperature using a fourth order polynomial. The heater control subroutine 480 gradually controls a ramp up/down of current applied to the heat module. The gradual ramp up/down increases the life and reliability of the heat module. Additionally, a built-in-fail-safe mode can be included to detect process safety compliance, and can shut down operation of the heat module if the processing chamber 10 is not properly set up.

The plasma control subroutine 490 comprises program code for setting the RF bias voltage power level applied to the process electrodes in the processing chamber 10, and optionally, to set the level of the magnetic field generated in the reactor. Similar to the previously described chamber component subroutines, the plasma control subroutine 490 is invoked by the chamber manager subroutine 440.

The method for depositing a low dielectric constant film of the present invention is not limited to any specific apparatus or to any specific plasma excitation method. The above CVD system description is mainly for illustrative purposes, and other CVD equipment such as electrode cyclotron resonance (ECR) plasma CVD devices, induction-coupled RF high density plasma CVD devices, or the like may be employed. Additionally, variations of the above described system such as variations in susceptor design, heater design, location of RF power connections and others are possible. For example, the substrate could be supported and heated by a resistively heated susceptor.

Deposition of a Low Dielectric Constant Film

Figure 3:
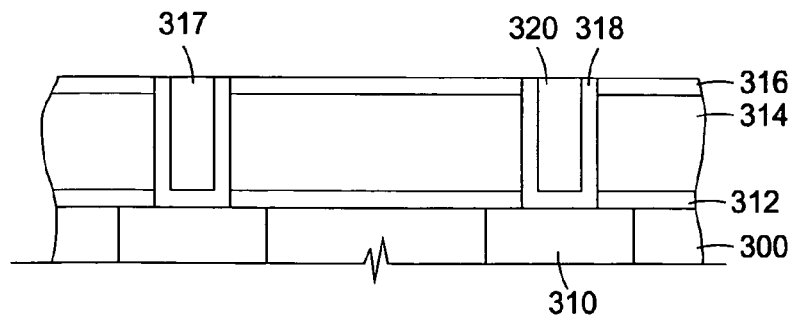
FIG. 3 is a cross sectional view showing a damascene structure comprising a low dielectric constant film as described herein.

FIG. 3 shows a damascene structure having a low dielectric constant film of the present invention deposited thereon. The low dielectric constant film is deposited as a dielectric layer 314 on a dielectric liner or barrier layer 312. A cap layer 316 is deposited on the dielectric layer 314. The cap layer 316 acts as an etch stop during further substrate processing or alternatively, as a liner layer. The cap layer 316, dielectric layer 314, and dielectric liner or barrier layer 312 are pattern etched to define the openings of interconnects 317 such as lines that expose underlying conducive features 310. A conductive liner/barrier layer 318 is deposited within the interconnects 317, and a conductive material 320 is deposited thereon to fill the interconnects 317. The substrate is typically planarized, as shown, after deposition.

Figure 4A:
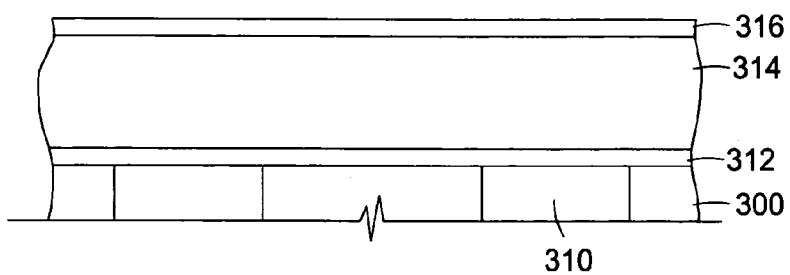
FIGS. 4A–4C are cross sectional views showing one embodiment of a damascene deposition sequence.
Figure 4B:
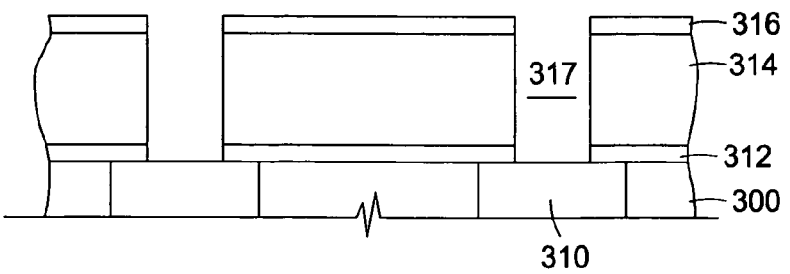
Figure 4C:
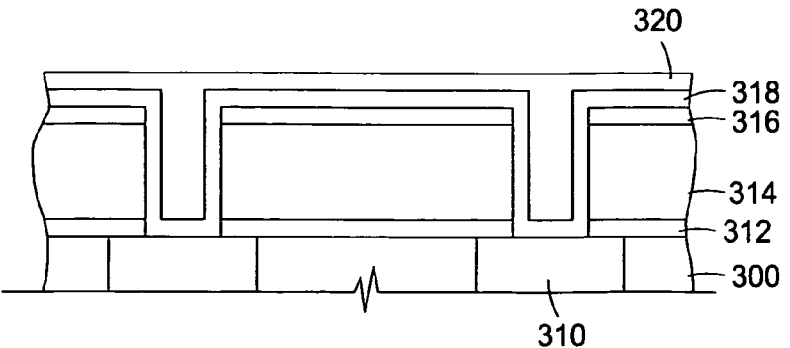

FIGS. 4A–4C are cross sectional views of a substrate 300 having the low dielectric constant film of the invention formed thereon. As shown in FIG. 4A, a dielectric layer 314 of the low dielectric constant film is deposited on the liner or barrier layer 312 to a thickness between about 5,000 Å to about 10,000 Å, depending on the size of the structure to be fabricated. The liner or barrier layer 312 may be a silicon carbide layer, for example, from the PECVD of an alkylsilane compound using a plasma of an inert gas. The silicon carbide layer may be doped with oxygen or nitrogen. The liner/barrier layer 312 may alternatively comprise another material, such as silicon nitride, which minimizes oxidation and/or diffusion of conductive materials, such as copper, which may comprise conductive features 310 previously formed in the substrate 300.

The cap layer 316, which can be a silicon carbide layer have a low dielectric constant, is then deposited on the dielectric layer 314 by reaction of the trimethylsilane to a thickness of about 200 Å to about 1000 Å using RF power in the range between about 10 and about 1000 watts for a 200 mm substrate. The silicon carbide material may be doped with oxygen or nitrogen.

As shown in FIG. 4B, the cap layer 316, the dielectric layer 314, and the liner or barrier layer 312 are then pattern etched to define the interconnects 317 and to expose the conductive feature 310 in substrate 300. Preferably, the cap layer 316, the dielectric layer 314, and the liner or barrier layer 312 are pattern etched using conventional photolithography and etch processes for silicon carbide films. Any photo resist or other material used to pattern the cap layer 316 is removed using an oxygen strip or other suitable process.

Following etching of the deposited material and removal of photo resist materials, exposed portions of the cap layer 316, the dielectric layer 314, and the liner or barrier layer 312 may be treated with a reactive pre-clean process to remove contaminants, particulate matter, residues, and oxides that may have formed on the exposed portions of the interconnects 317 and on the surface of the substrate. The reactive pre-clean process comprises exposing the substrate to a plasma, preferably comprising hydrogen, argon, helium, nitrogen, or mixtures thereof, at a power density between of 0.03 watts/cm$^2$ and about 3.2 watts/cm$^2$, or at a power level between about 10 watts and 1000 watts for a 200 millimeter substrate. The processing chamber is maintained at a pressure of about 20 Torr or less and at a substrate temperature of about 450° C. or less during the reactive clean process.

Referring to FIG. 4C, after the cap layer 316, the dielectric layer 314, and the liner or barrier layer 312 have been etched to define the interconnects 317 and the photo resist has been removed, the interconnects 317 are filled with a conductive material 320. The structure is preferably formed with a conductive material such as aluminum, copper, tungsten, or combinations thereof. Presently, the trend is to use copper to form the smaller features due to the low resistivity of copper (1.7 Ω-cm compared to 3.1 Ω-cm for aluminum).

Preferably, the conductive barrier layer 318 is first deposited conformably in the interconnects 317 to prevent copper migration into the surrounding silicon and/or dielectric material. Barrier layers include titanium, titanium nitride, tantalum, tantalum nitride, and combinations thereof among other conventional barrier layer materials. Thereafter, copper 320 is deposited using chemical vapor deposition, physical vapor deposition, electroplating, or combinations thereof, to form the conductive structure. Once the structure has been filled with copper or other conductive material, the surface is planarized using chemical mechanical polishing to produce the finished damascene structure shown in FIG. 3.

Figure 5:
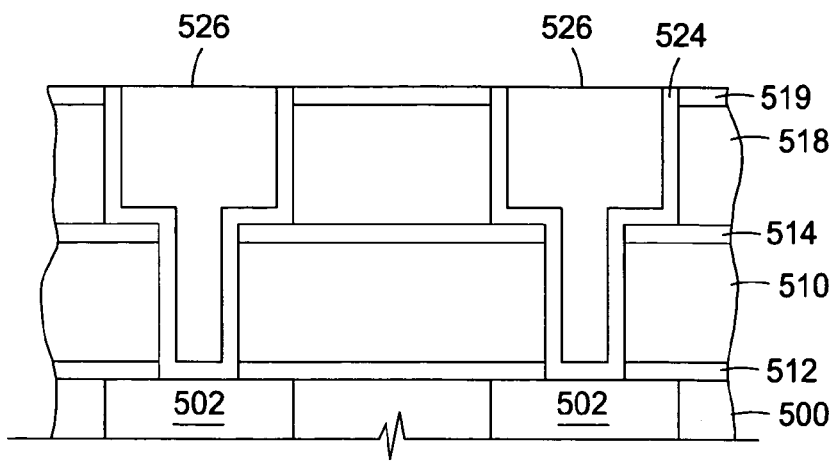
FIG. 5 is a cross sectional view showing a dual damascene structure comprising two low dielectric constant films as described herein.

FIG. 5 shows dual damascene structure which includes two low dielectric constant films and two silicon carbide cap layers or doped silicon carbide cap layers deposited thereon. A conductive feature 502 is formed in a substrate 500. The first low dielectric constant film is deposited as a first dielectric layer 510 on a liner or barrier layer 512, for example, silicon carbide. A first silicon carbide cap layer 514 is deposited on the first dielectric layer 510. The silicon carbide cap layer 514 reduces the dielectric constant of the low dielectric constant film and is pattern etched to define the openings of vertical interconnects such as contacts/vias. For the dual damascene application, a second dielectric layer 518 comprising the second low dielectric constant film is deposited over the patterned silicon carbide cap layer 514. The second silicon carbide cap layer 519 is deposited on the second dielectric layer 518 and pattern etched to define horizontal interconnects such as lines. An etch process is performed to define the horizontal interconnects down to the first silicon carbide layer 514 which functions as an etch stop, and to define the vertical interconnects and expose the conductive feature 502 in substrate 500 prior to filling the interconnects with a conductive material 526.

Figure 6A:
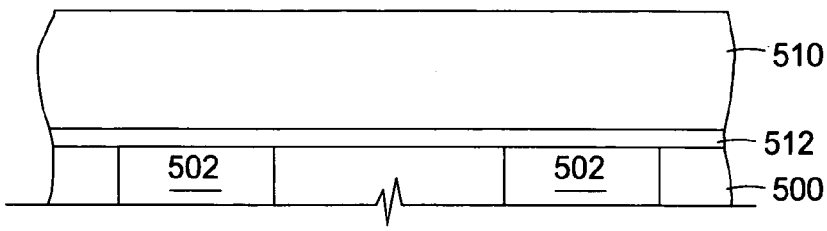
FIGS. 6A–6E are cross sectional views showing one embodiment of a dual damascene deposition sequence.

A preferred method for making the dual damascene structure shown in FIG. 5 is sequentially depicted in FIGS. 6A–6E, which are cross sectional views of a substrate having the low dielectric constant film of the invention formed thereon. As shown in FIG. 6A, an initial first dielectric layer 510 of the low dielectric constant film is deposited on the liner or barrier layer 512 to a thickness between about 5,000 Å and about 10,000 Å, depending on the size of the structure to be fabricated. The liner layer 512 may be a silicon carbide layer, which may be doped with oxygen or nitrogen. The liner/barrier layer 512 may alternatively comprise another material, such as silicon nitride, which minimizes oxidation and/or diffusion of conductive materials, such as copper, which may comprise conductive features 502 previously formed in the substrate 500.

Figure 6B:
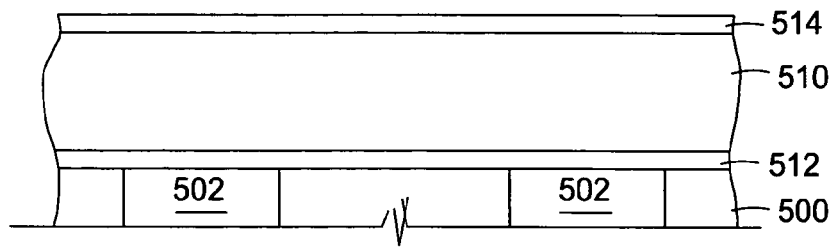
Figure 6C:
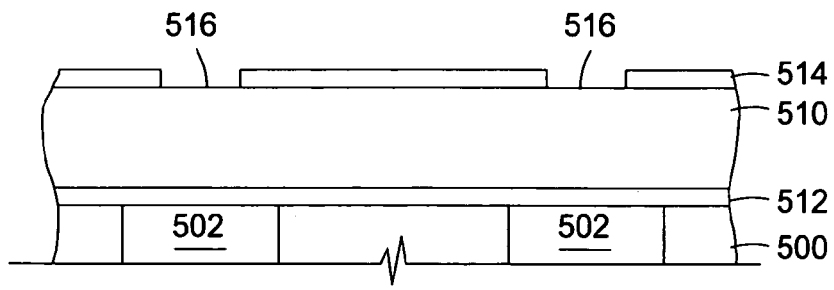

As shown in FIG. 6B, the first cap layer 514, which includes a silicon carbide layer or doped silicon carbide layer is then deposited on the first dielectric layer to a thickness between about 200 and about 1000 Å using RF power in the range between about 10 and about 1000 watts for a 200 mm substrate. The first cap layer 514 is then pattern etched to define the contact/via openings 516 and to expose first dielectric layer 510 in the areas where the contacts/vias are to be formed as shown in FIG. 6C. Preferably, the first cap layer 514 is pattern etched using conventional photolithography and etch processes for silicon carbide films.

Figure 6D:
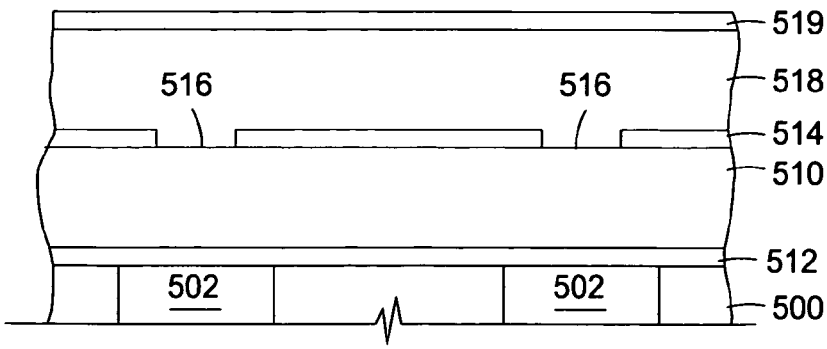

After the first cap layer 514 has been etched to pattern the contacts/vias 516 and the photo resist has been removed, a second dielectric layer 518 is deposited over the first cap layer 514 to a thickness between about 5,000 Å and about 10,000 Å as described for the first dielectric layer 510 as shown in FIG. 6D.

Figure 6E:
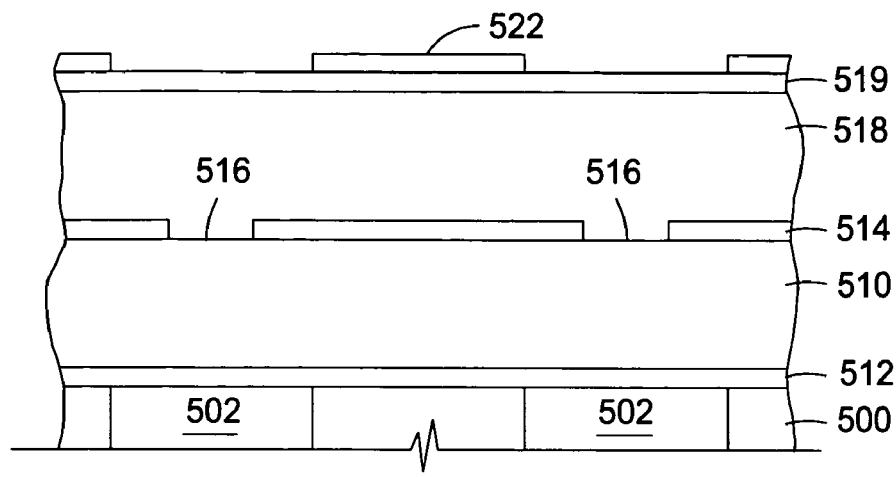
Figure 6F:
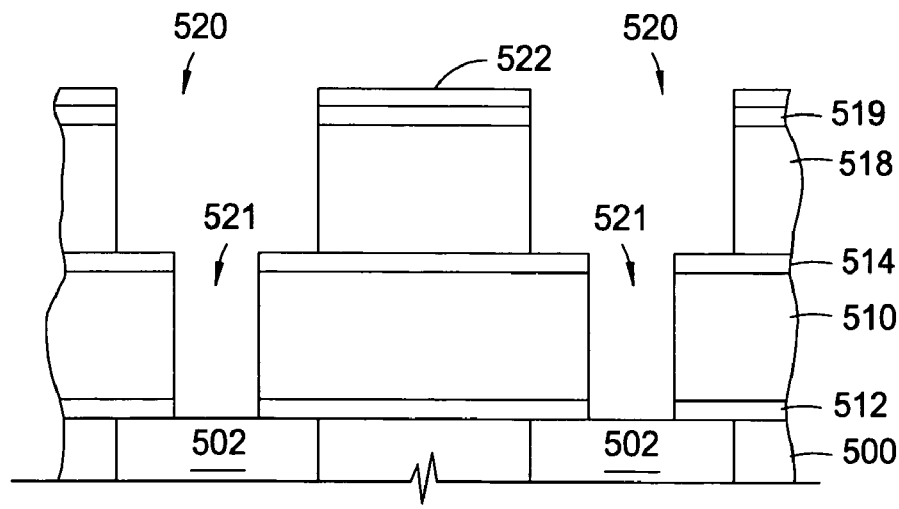

A second cap layer 519, which includes a silicon carbide layer or doped silicon carbide layer is then deposited on the second dielectric layer 518 to a thickness of about 200 to about 1000 Å. The silicon carbide material may be doped with oxygen or nitrogen. The second cap layer 519 is then patterned to define lines 520, as shown in FIG. 6E. The lines 520 and contacts/vias 521 are then etched using reactive ion etching or other anisotropic etching techniques to define the metallization structure (i.e., the openings for the lines and contact/via) and expose the conductive feature 502 as shown in FIG. 6F. Any photo resist or other material used to pattern and etch the second cap layer 519 is removed using an oxygen strip or other suitable process.

Following etching of the deposited material and removal of photo resist materials, exposed portions of the second cap layer 519, the second dielectric layer 518, the first cap layer 514, the first dielectric layer 510, and the liner or barrier layer 512 may be treated with a reactive pre-clean process, as described above, to remove contaminants, particulate matter, residues, and oxides that may have formed on the exposed portions of the contact/via openings 516, the line openings 520, and the conductive feature 502.

Figure 6G:
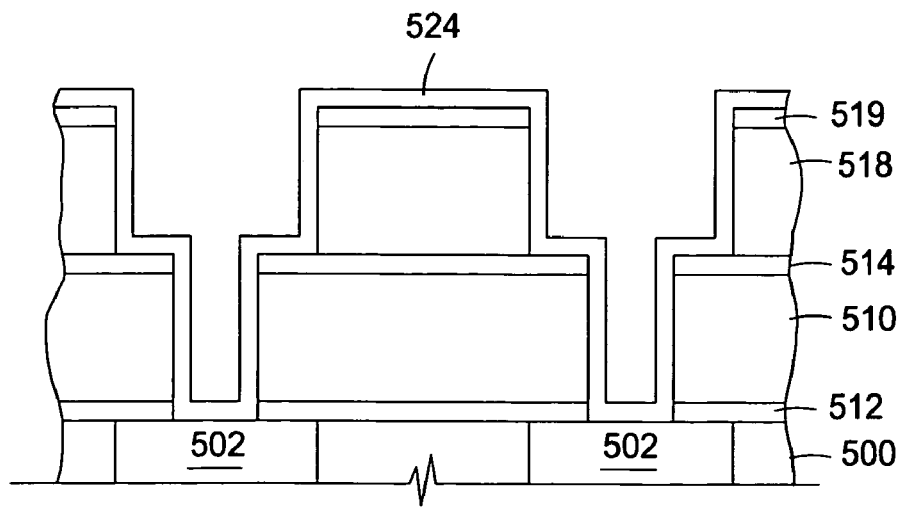

The metallization structure is then formed with a conductive material such as aluminum, copper, tungsten or combinations thereof. Presently, the trend is to use copper to form the smaller features due to the low resistivity of copper (1.7 Ω-cm compared to 5.1 Ω-cm for aluminum). Preferably, as shown in FIG. 6G, a conductive barrier layer 524 is first deposited conformably in the metallization pattern to prevent copper migration into the surrounding silicon and/or dielectric material. Barrier layers include titanium, titanium nitride, tantalum, tantalum nitride, and combinations thereof among other conventional barrier layer materials. Thereafter, copper 526 is deposited using either chemical vapor deposition, physical vapor deposition, electroplating, or combinations thereof to form the conductive structure. Once the structure has been filled with copper or other metal, the surface is planarized using chemical mechanical polishing as shown in FIG. 5.

Figure 7:
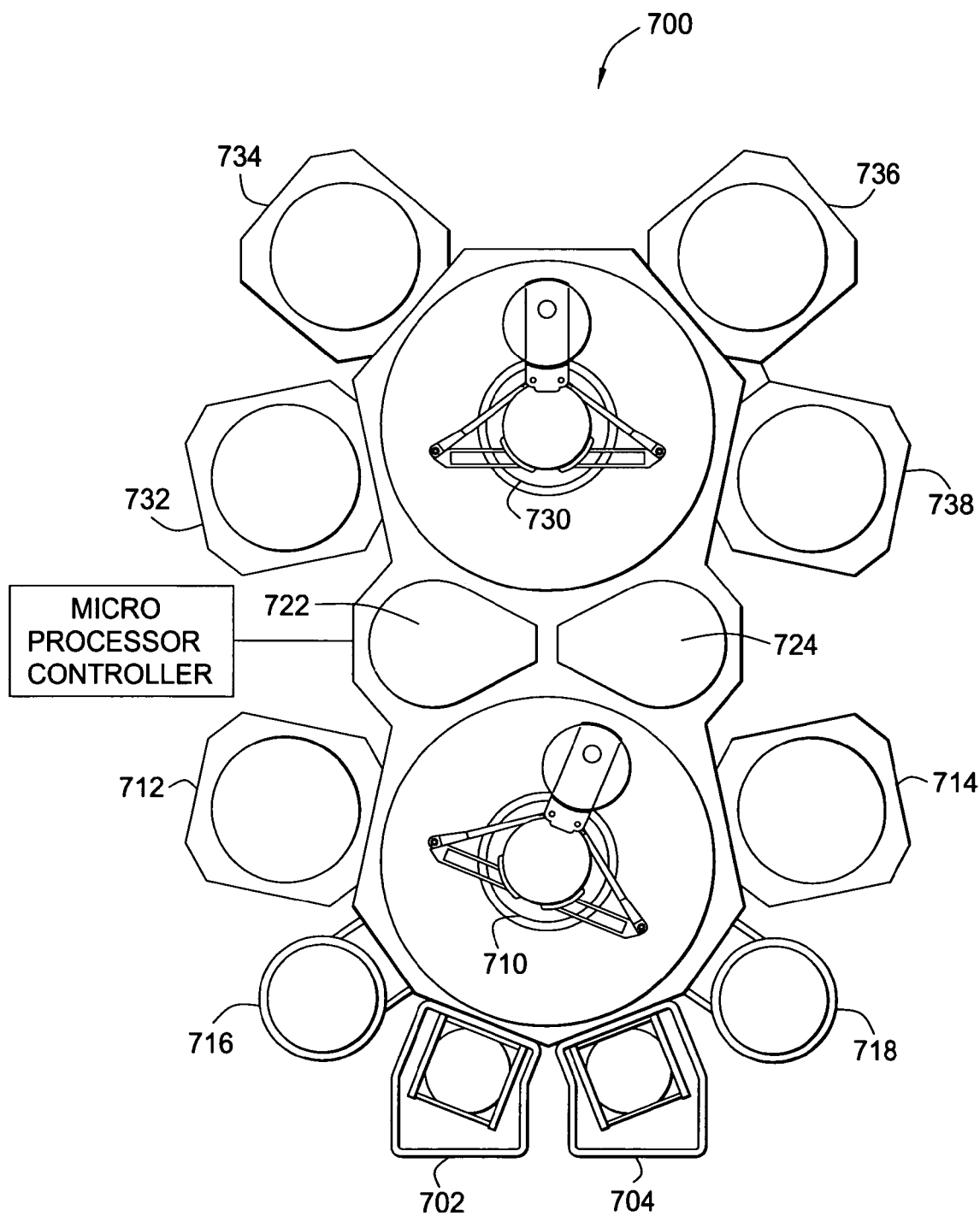
FIG. 7 shows an exemplary integrated processing platform.

These processing steps are preferably integrated on a processing platform to avoid interim contamination of the substrate. One exemplary integrated processing tool is an ENDURA® platform available from Applied Materials, Inc. of Santa Clara, Calif. FIG. 7 shows a schematic plan view of an exemplary multi-chamber processing system 700, such as the ENDURA® platform. A similar multi-chamber processing system is disclosed in U.S. Pat. No. 5,186,718, entitled "Stage Vacuum Wafer Processing System and Method," issued on Feb. 16, 1993, which is incorporated by reference herein.

The system 700 generally includes load lock chambers 702, 704 for the transfer of substrates into and out from the system 700. Since the system 700 is typically under vacuum, the load lock chambers 702, 704 may "pump down" the substrates introduced into the system 700. A first robot 710 may transfer the substrates between the load lock chambers 702, 704, and a first set of one or more substrate processing chambers 712, 714, 716, 718 (four are shown). Each processing chamber 712, 714, 716, 718, can be outfitted to perform a number of substrate processing operations such as cyclical layer deposition, chemical vapor deposition (CVD), physical vapor deposition (PVD), etch, pre-clean, degas, orientation and other substrate processes. The first robot 710 also transfers substrates to and from one or more transfer chambers 722, 724.

The transfer chambers 722, 724, are used to maintain ultrahigh vacuum conditions while allowing substrates to be transferred within the system 700. A second robot 730 may transfer the substrates between the transfer chambers 722, 724 and a second set of one or more processing chambers 732, 734, 736, 738. Similar to processing chambers 712, 714, 716, 718, the processing chambers 732, 734, 736, 738 can be outfitted to perform a variety of substrate processing operations, such as cyclical deposition, chemical vapor deposition (CVD), physical vapor deposition (PVD), etch, pre-clean, degas, and orientation, for example. Any of the substrate processing chambers 712, 714, 716, 718, 732, 734, 736, 738 may be removed from the system 700 if not necessary for a particular process to be performed by the system 700.

In one arrangement, each processing chamber 732 and 738 may be a cyclical deposition chamber adapted to deposit a nucleation layer; each processing chamber 734 and 736 may be a cyclical deposition chamber, a chemical vapor deposition chamber, or a physical vapor deposition chamber adapted to form a bulk fill deposition layer; each processing chamber 712 and 714 may be a chemical vapor deposition chamber, or a cyclical deposition chamber adapted to deposit a dielectric layer as described herein; and each processing chamber 716 and 718 may be an etch chamber outfitted to etch apertures or openings for interconnect features. This one particular arrangement of the system 700 is provided to illustrate the invention and should not be used to limit the scope of the invention.

The following example illustrates the low dielectric films of the present invention. The films were deposited on 300 mm substrates using a chemical vapor deposition chamber, such as the Producer® DxZ system which has two isolated processing regions per chemical vapor deposition chamber and is available from Applied Materials, Inc. of Santa Clara, Calif.

EXAMPLE 1

A low dielectric constant film was deposited on a 300 mm substrate at about 8 Torr and a substrate temperature of about 225° C. The following processing gases and flow rates were used:
Trimethylsilane (TMS), at 1,000 sccm;
Alpha-terpinene (ATP), at 3,000 mgm;
Oxygen, at 200 sccm; and
Helium, at 1,500 sccm.

The substrate was positioned 300 mils from the gas distribution showerhead. A power level of 600 W at a frequency of 13.56 MHz was applied to the showerhead for plasma enhanced deposition of the films. The film was deposited at a rate of about 1,000 Å/min. The film was subjected to a high temperature electron beam (e-beam) treatment using a dose of about 150 µc/cm$^2$, at about 4.5 KeV and 1.5 mA, and at about 400° C. The e-beam treatment lasted for about 4 minutes. Following the e-beam treatment, the film exhibited a dielectric constant of about 2.5 as measured using SSM 5100 Hg CV measurement tool at 0.1 MHz. The film had a refractive index of 1.35.

EXAMPLE 2

A low dielectric constant film was deposited on a substrate at about 8 Torr and a temperature of about 225° C. The following processing gases and flow rates were used:
Alpha-terpinene (ATP), at 3,000 mgm;
Trimethylsilane (TMS), at 500 sccm;
Diethoxymethylsilane (DEMS), at 600 mgm;
Oxygen, at 100 sccm; and
Carbon dioxide, at 1,500 sccm.

The substrate was positioned about 300 mils from the gas distribution showerhead. A power level of 600 W at a frequency of 13.56 MHz was applied to the showerhead for plasma enhanced deposition of the films. The film was deposited at a rate of about 2,000 Å/min, and had a dielectric constant (k) of about 4.3 measured using a SSM 5100 Hg CV measurement tool at 0.1 MHz. The film also exhibited a hardness of about 0.1 GPa.

E-BEAM @ 400° C. and 200 µc/cm$^2$:

The deposited film was subjected to a high temperature electron beam (e-beam) treatment using a dose of about 200 µc/cm$^2$, at about 4.5 KeV and 1.5 mA, and at about 400° C. The e-beam treatment lasted for about 30 seconds. Following the e-beam treatment, the film exhibited a dielectric constant of about 2.2 which is about 50% less than the non-cured film. The e-beam film also exhibited a hardness of about 0.7 GPa, which is about a 600% increase compared to the non-cured film.

EXAMPLE 3

A low dielectric constant film was deposited on a substrate at about 8 Torr and a temperature of about 225° C. The following processing gases and flow rates were used:
Alpha-terpinene (ATP), at 4,000 mgm;
Trimethylsilane (TMS), at 1,000 sccm;
Octamethylcyclotetrasiloxane (OMCTS), at 200 mgm
Oxygen, at 100 sccm; and
Carbon dioxide, at 1,500 sccm.

The substrate was positioned about 300 mils from the gas distribution showerhead. A power level of 500 W at a frequency of 13.56 MHz was applied to the showerhead for plasma enhanced deposition of the films. The film was deposited at a rate of about 1,600 Å/min, and had a dielectric constant (k) of about 4.5 measured using a SSM 5100 Hg CV measurement tool at 0.1 MHz. The film also exhibited a hardness of about 0.1 GPa.

E-BEAM @ 400° C. and 200 µc/cm$^2$:

The deposited film was subjected to a high temperature electron beam (e-beam) treatment using a dose of about 200 µc/cm$^2$, at about 4.5 KeV and 1.5 mA, and at about 400° C. The e-beam treatment lasted for about 30 seconds. Following the e-beam treatment, the film exhibited a dielectric constant of about 2.3 which is about 50% less than the non-cured film. The e-beam film also exhibited a hardness of about 0.7 GPa, which is about a 600% increase compared to the non-cured film.

While the foregoing is directed to embodiments of the present invention, other and further embodiments of the invention may be devised without departing from the basic scope thereof, and the scope thereof is determined by the claims that follow.

What is claimed is:

1. A method for depositing a dielectric film, comprising delivering a gas mixture comprising one or more linear, oxygen-free organosilicon compounds, one or more oxygen-free hydrocarbon compounds comprising one ring and one or two carbon-carbon double bonds in the ring, and one or more oxidizing gases comprising oxygen ($O_2$) to a substrate surface at deposition conditions sufficient to deposit a dielectric film comprising Si, O, and C on the substrate surface, wherein the one or more linear, oxygen-free organosilicon compounds comprises trimethylsilane and the one or more oxygen-free hydrocarbon compounds comprises alpha-terpinene.

2. The method of claim 1, wherein the one or more oxidizing gases consists of carbon dioxide and oxygen ($O_2$).

3. A method for depositing a dielectric film, comprising delivering a gas mixture comprising one or more linear, oxygen-free organosilicon compounds, one or more oxygen-free hydrocarbon compounds including the structure:

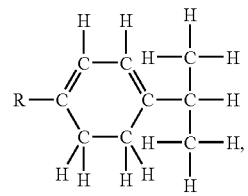

wherein R is selected from the group consisting of linear alkane groups having one to five carbons, and one or more oxidizing gases comprising oxygen ($O_2$) to a substrate surface at deposition conditions sufficient to deposit a dielectric film comprising Si, O, and C on the substrate surface.

4. The method of claim 3, wherein the one or more oxygen-free hydrocarbon compounds comprises alpha-terpinene.

5. The method of claim 3, wherein the one or more linear, oxygen-free organosilicon compounds comprises a member selected from the group consisting of methylsilane, dimethylsilane, trimethylsilane, tetramethylsilane, ethylsilane, disilanomethane, bis(methylsilano)methane, 1,2-disilanoethane, 1,2-bis(methylsilano)ethane, 2,2-disilanopropane, diethylsilane, propylsilane, vinylmethylsilane, 1,1,2,2-tetramethyldisilane, hexamethyldisilane, 1,1,2,3,3-pentamethyltrisilane, 1,3-bis(methylsilano)propane, 1,2-bis(dimethylsilano) ethane, 1,3-bis(dimethylsilano)propane, and combinations thereof.

6. The method of claim 3, wherein the linear alkane groups having one to five carbons are selected from the group consisting of methyl, ethyl, propyl, and isopropyl groups.

7. The method of claim 3, wherein the one or more oxidizing gases further comprises a member selected from the group consisting of ozone, carbon dioxide, carbon monoxide, water, nitrous oxide, 2,3-butanedione, and combinations thereof.

8. The method of claim 3, further comprising treating the dielectric film with an electron beam.

9. A method for depositing a dielectric film, comprising:
delivering a gas mixture comprising:
one or more linear, oxygen-free organosilicon compounds:
one or more oxygen-free hydrocarbon compounds comprising one ring and one or two carbon-carbon double bonds in the ring, wherein the one or more oxygen-free hydrocarbon compounds comprises alpha-terpinene;
and one or more oxidizing gases comprising oxygen ($O_2$) to a substrate surface at deposition conditions sufficient to deposit a dielectric film comprising Si, O, and C on the substrate surface; and
treating the dielectric film with an electron beam.

10. The method of claim 9, wherein the one or more linear, oxygen-free organosilicon compounds comprises trimethylsilane and the one or more oxidizing gases comprises carbon dioxide and oxygen ($O_2$).

* * * * *

UNITED STATES PATENT AND TRADEMARK OFFICE
CERTIFICATE OF CORRECTION

PATENT NO. : 7,056,560 B2 Page 1 of 1
APPLICATION NO. : 10/773060
DATED : June 6, 2006
INVENTOR(S) : Kang Sub Yim et al.

It is certified that error appears in the above-identified patent and that said Letters Patent is hereby corrected as shown below:

On the Cover of the Patent

Item [73], Assignee: Please change the assignee from "Applies Materials Inc." to --Applied Material Inc.--

In the Specification

Column 9, Line 57: Change "code-for" to --code for--

Columns 17 and 18: Change "mon oxide" to --monoxide--

Signed and Sealed this

Seventeenth Day of October, 2006

JON W. DUDAS
*Director of the United States Patent and Trademark Office*